United States Patent [19]
Brown et al.

[11] Patent Number: 6,146,993
[45] Date of Patent: Nov. 14, 2000

[54] METHOD FOR FORMING IN-SITU IMPLANTED SEMICONDUCTOR BARRIER LAYERS

[75] Inventors: Dirk Brown, Santa Clara; John A. Iacoponi, San Jose, both of Calif.

[73] Assignee: Advanced Micro Devices, Inc., Sunnyvale, Calif.

[21] Appl. No.: 09/198,061

[22] Filed: Nov. 23, 1998

[51] Int. Cl.[7] .............................................. H01L 21/4763
[52] U.S. Cl. .......................... 438/627; 438/643; 438/648; 438/654; 438/656; 438/660; 438/685
[58] Field of Search ...................... 438/627, 643, 438/648, 653, 654, 656, 660, 685

[56] References Cited

U.S. PATENT DOCUMENTS

| | | | |
|---|---|---|---|
| 5,780,356 | 7/1998 | Kim | 438/627 |
| 5,801,097 | 9/1998 | Chang | 438/643 |
| 5,827,777 | 10/1998 | Schinella et al. | 438/629 |

*Primary Examiner*—John F. Niebling
*Assistant Examiner*—David A Zarneke
*Attorney, Agent, or Firm*—Mikio Ishimaru

[57] ABSTRACT

A method is provided for forming barrier layers in channel or via openings of semiconductors by using in-situ nitriding of barrier metals (Ta, Ti, or W) after they have been deposited in channel and via openings which will allow better control of the barrier metal/barrier material (Ta/TaN, Ti/TiN, or W/WN) composition, eliminate particle problems, and avoiding target poisoning.

18 Claims, 2 Drawing Sheets

METHOD FOR FORMING IN-SITU IMPLANTED SEMICONDUCTOR BARRIER LAYERS

TECHNICAL FIELD

The present invention relates generally to semiconductors and more specifically to barrier layers used in semiconductor processing.

BACKGROUND ART

In the past in the manufacturing of integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductive material and to act as a barrier material to prevent diffusion of such conductive material into the oxide layer and the semiconductor devices (the combination of the adhesion and barrier material is collectively referred to as "barrier layer herein). It should be noted that some barrier materials also have good adhesion which is why the adhesion layer is optional. A "seed" layer is then deposited to act as a seed for additional conductive material to be deposited. A first conductive material is then deposited and subjected to a chemical-mechanical polishing process which removes the first conductive material above the first channel oxide layer and damascenes the first conductive material in the first channel openings to form the first channels.

For multiple layers of channels, another metalization process, which is called the "dual damascene" technique, is used in which the channels and vias are formed at the same time. In one example, the via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via. A second chemical mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), titanium nitride (TiN), or tungsten nitride (WN) are used as barrier materials for copper. A thin adhesion layer formed of an adhesion material, such as pure tantalum (Ta), titanium (Ti), or tungsten (W), is first deposited on the dielectrics or vias to ensure good adhesion and good electrical contact of the subsequently deposited barrier layers to underlying doped regions and/or conductive channels. Barrier layer stacks formed of adhesion/barrier materials such as tantalum/tantalum nitride (Ta/TaN), titanium/titanium nitride (Ti/TiN), and tungsten/tungsten nitride (W/WN) have been found to be useful as adhesion/barrier material combination for copper interconnects.

The "barrier effectiveness" of a barrier layer with respect to a conductive material is its ability to prevent diffusion of the conductive material. The barrier effectiveness of a barrier layer is determined in part by its thickness, including the thickness uniformity or density, and its quality, including the number and sizes of defects such as pinholes which form on deposition.

Barrier layers in a damascene process are traditionally deposited by sputter deposition. A problem associated with this deposition technique is that the nitrided barrier material is sputtered from the barrier metal target in a nitrogen atmosphere and is very difficult to control. The composition of the barrier metal/barrier material is very difficult to control and is susceptible to particle problems since two separate deposition steps, usually sputtering, are involved. In addition, the barrier metal target often becomes "poisoned" with nitrogen so it can not be used for forming the adhesion layers for subsequent semiconductors.

A solution, which would allow better control of the barrier metal/barrier material composition, eliminate particle problems, and avoiding target poisoning has long been sought, but has eluded those skilled in the art. As the semiconductor industry is moving from aluminum to copper and other type of materials with greater electrical conductivity and diffusiveness through dielectrics, it is becoming more pressing that a solution be found.

DISCLOSURE OF THE INVENTION

The present invention provides a method for forming barrier layers in channel or via openings by using in-situ nitriding of barrier metals after they have been deposited in channel and via openings.

The present invention further provides a method for forming barrier layers in channel or via openings by using in-situ nitriding of barrier metals after they have been deposited in channel and via openings which will allow better control of the barrier metal/barrier material composition, eliminate particle problems, and avoiding target poisoning.

The present invention still further provides a method for forming barrier layers in channel or via openings by using in-situ nitriding of barrier metals after they have been deposited in channel and via openings which will allow better control of the barrier material density to improve barrier effectiveness.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
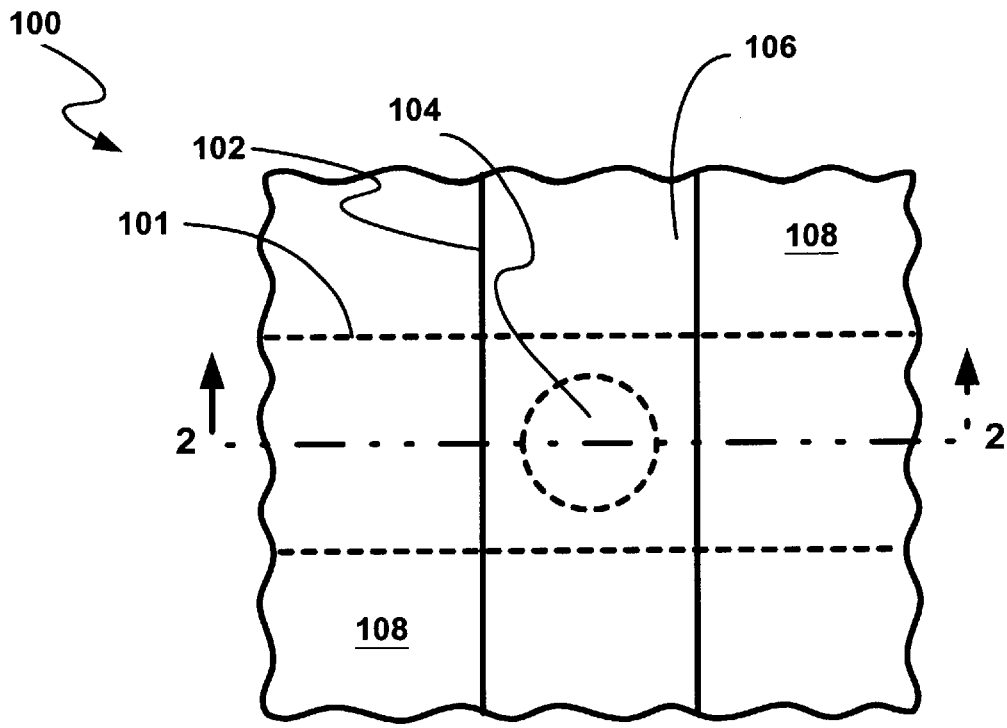
FIG. 1 (PRIOR ART) is a plan view of aligned channels with a prior art via.

Referring now to FIG. 1 (PRIOR ART), therein is shown a plan view of a prior art pair of perpendicularly aligned semiconductor channels of a conductive material such as aluminum or copper, disposed over a production semiconductor wafer 100. A first conductive channel 101 is shown disposed below a second conductive channel 102 which extends substantially perpendicular to the first conductive channel 101 in the plan view. Similarly, a round via 104 connects the first and second conductive channels 101 and 102 and is a part of the second conductive channel 102. The first conductive channel 101 contains a first conductive material. The second conductive channel 102 is formed by filling a second channel opening 106 disposed in a second channel oxide layer 108 with a second conductive material. The second channel opening 106 is defined by walls (sidewalls) 109 of a second oxide layer 108.

Figure 2:
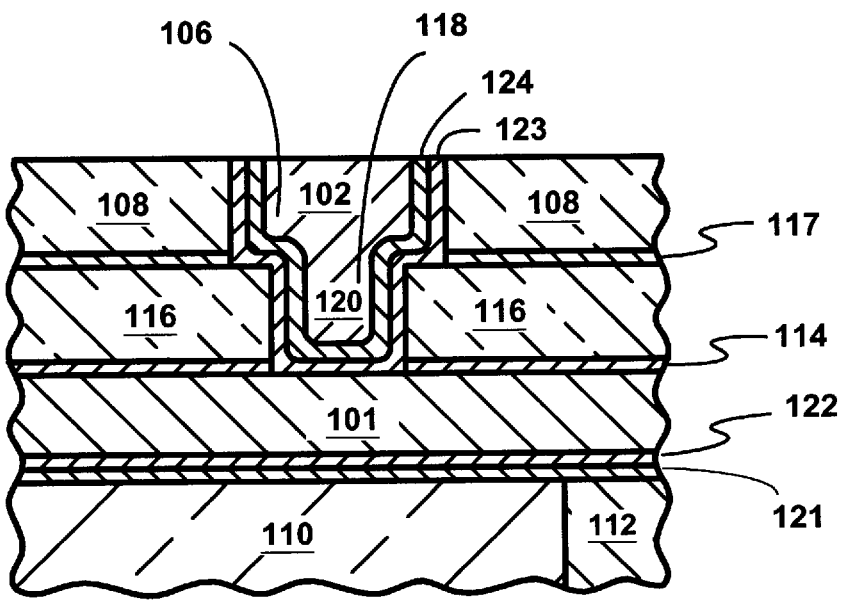
FIG. 2 (PRIOR ART) is a cross-section of FIG. 1 (PRIOR ART) along line 2—2.

Referring now to FIG. 2 (PRIOR ART) therein is shown a cross-section of FIG. 1 (PRIOR ART) along the line 2—2. The first conductive channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1 defines a cylindrical via 120 when it is filled with the second conductive material.

Also shown disposed around the first conductive channel 101 are a barrier layer 121 and a seed layer 122, and around the second conductive channel 102 and the cylindrical via 120 are a barrier layer 123 and a seed layer 124. The barrier layers 121 and 123 include metals which are sometimes barrier metals such as tantalum (Ta), titanium (Ti), and tungsten (W) since they adhere well to the dielectrics used and to the barrier materials which are often the nitrides of these metals. The barrier layers 121 and 123 include barrier materials and, where necessary, are used to prevent diffusion of the conductive materials, which are copper or copper alloys, into the adjacent areas of the semiconductor. Tantalum nitride (TaN), titanium nitride (TiN) and tungsten nitride (WN) are examples of barrier materials for copper channels. Generally, a pure barrier metal provides good adhesive characteristics but is not as good a barrier to diffusion as the alloyed metal. At the same time, the pure barrier metal is a good conductor while the alloyed metal has greater resistivity. The conductive materials are much better conductors than the barrier metals and materials so it is desirable that the barrier layer be as thin as possible overall.

Figure 3:
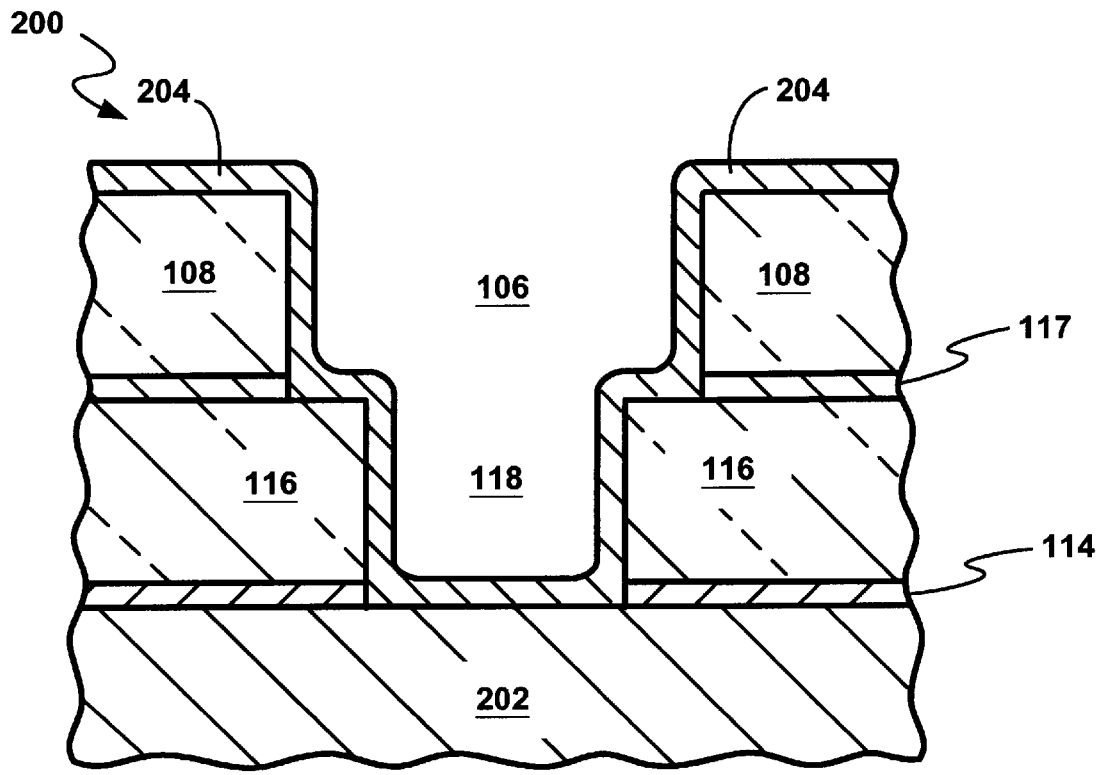
FIG. 3 is a close-up cross-section similar to that of FIG. 1 along line 2—2 immediately after the deposition of barrier metal in the second channel opening.

Referring now to FIG. 3 therein is shown a close-up cross section of a semiconductor wafer 200 similar to the cross-section of FIG. 1 taken along the line 2—2. FIG. 3 shows the first channel second channel opening 106 and the via opening 118 after the deposition of the barrier layer 204 and prior to the filling of the second channel opening 106 and via opening 118 with conductive material such as copper or copper-based alloys. The barrier layer 204 shown in FIG. 3 is pure barrier metal of Ta, Ti, or W. The barrier layer 204 is deposited to the desired thickness by a one of a number of deposition processes which include, but are not limited to, physical vapor deposition, chemical vapor deposition, electroplating, etc. Generally, the deposition thickness of the barrier layer 204 would be about the same as the thickness of the barrier layer 123 of FIG. 2. This FIG. 3 best shows how the barrier layer 204 completely covers the channel and via dielectrics. For convenience of illustration, like reference numerals are used in FIG. 3 to denote like elements already described in FIG. 1 and FIG. 2.

Figure 4:
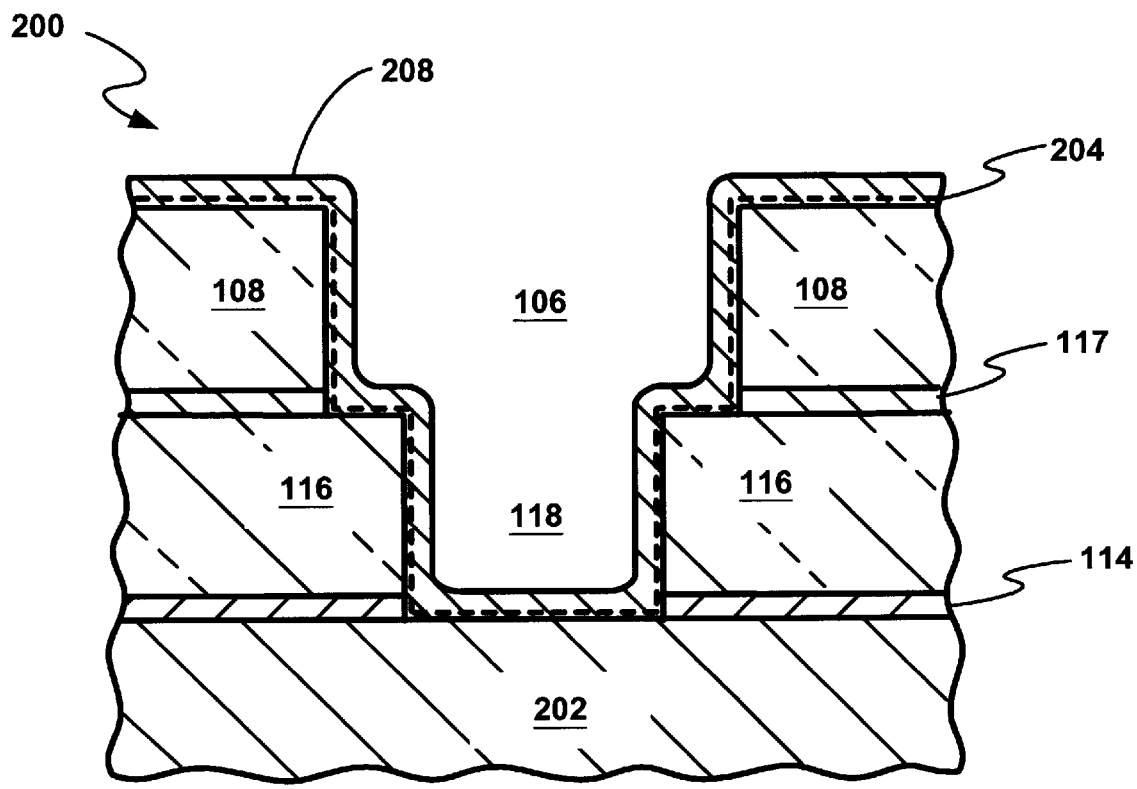
FIG. 4 is a simplified cross-section of FIG. 3 formed in accordance with the present invention

Referring now to FIG. 4, therein is shown the cross-section of a semiconductor wafer 200 of FIG. 3 after the deposited barrier layer 204 is processed to form a barrier material 208. The preferred barrier material 208 is TaN, TiN, or WN. A dotted line represents where the barrier metal 204 and the barrier material 208 meet. It should be understood that there is a blending of the two depending on the nitriding time and temperature. The dotted line would be a fairly sharp boundary for a nitrogen plasma nitriding while it could be gradated for nitriding in an oven in a nitrogen or ammonium atmosphere. For convenience of illustration, like reference numerals are used in FIG. 4 to denote like elements already described in FIG. 1 and FIG. 2.

In production, a conventional first damascene process is used to put down the first conductive channel 202 in a first channel oxide layer on the semiconductor wafer 200. The damascene technique is the photolithographic process which uses a mask to define the first channel opening (not shown) in the first channel oxide layer (not shown). The barrier layer (not shown) is then deposited by a sputter deposition process. The barrier layer is then nitrided, as hereinafter explained, for the second channel. The first channel opening is then lined with a seed layer and filled with the conductive material to form the first conductive channel 202 using the previously mentioned metal deposition techniques. A chemical-mechanical polishing step is then used to bring the barrier layer and the conductive layer level with the top of the dielectric for the next steps in processing.

The stop nitride layer 114, the via oxide layer 116, and the via nitride layer 117 would be successively deposited on top of the first conductive channel 202 and the first channel oxide layer using conventional deposition processes. By using the via photoresist and the via photolithographic process followed by nitride etching of a round via opening 104 in the via nitride layer 117, the basis for the cylindrical via 118 is formed. The subsequent deposition of the second channel oxide layer 108 prepares the way for the second channel 106 to be perpendicular to the first conductive channel 202.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 3 than in the horizontal direction. The nitride etch of the stop nitride layer 114 exposes a portion of the first conductive channel 202 and completes the etching steps.

Thereafter, the thin barrier layer 204 is deposited in and coats the walls of the second channel opening 106 and the cylindrical via opening 118. The barrier layer 204 is deposited by a sputter deposition technique using targets of pure barrier metal.

There are a number of factors which must be considered in the nitriding process. It is desirable to have as thin a barrier layer as possible, but a low resistivity barrier mitigates towards having a relatively thick barrier metal volume and the desire to minimize diffusion of conductive material makes it desirable to have a relatively thick barrier material volume. These factors include process, time, temperature, atmosphere, etc. Nitrogen plasma nitriding of the semiconductor wafer 200 is performed using high density plasmas at pressures of 200 milliTorr to 20 Torr (lower pressures used for smaller geometries) for a step boundary from barrier metal to material. Oven baking of the semiconductor wafer 200 at 350° C. to 500° C. in a nitrogen or ammonium atmosphere provides slower diffusion of nitrogen into the barrier metal and a more gradated transition from the barrier metal to the material. This process will also increase the density of the layer.

Next, the second conductive material (not shown) would be deposited into second channel opening 106 and via opening 118 using conventional metal deposition techniques. Thereafter, a chemical mechanical polishing process is used to complete the process.

While the best mode utilizes copper as the conductive material, it should be understood that the present invention is applicable to other conductive materials such as aluminum, copper, copper-base alloys, gold, gold-base alloys, silver, silver-base alloys, doped silicon, polysilicon, and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention. In addition, while the embodiments of the present inventions form a barrier layer in a channel opening and a via opening atop another conductive channel it should be understood that the present invention is applicable to forming a barrier layer in a channel opening and/or a via opening atop a conductive or a doped region formed on a semiconductor substrate (as shown in FIG. 2 (PRIOR ART)).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and nonlimiting sense.

The invention claimed is:

1. A method of manufacturing a semiconductor device, comprising the steps of:

providing a semiconductor substrate with a dielectric layer formed thereon;

forming an opening in said dielectric layer, said opening defined by walls of said dielectric layer;

forming a barrier layer of barrier metal over said dielectric layer and in said opening, including along said walls;

forming a barrier material in said barrier layer in-situ at a controlled temperature in a barrier gas containing atmosphere to control the depth and density of barrier material of said barrier metal whereby said barrier material is gradated to increase away from said dielectric layer; and forming a layer of conductive material in contact with barrier material in said barrier layer, said conductive material layer substantially filling said opening.

2. The method as claimed in claim 1 including a step of controlling said step of forming said barrier material to control the depth of said barrier material formation in said barrier metal whereby said barrier material forms a layer above said barrier metal.

3. The method as claimed in claim 1 wherein said step of forming said barrier material in said barrier layer is performed using a plasma.

4. The method as claimed in claim 1 wherein said step of forming said barrier material in said barrier layer is performed using a high density plasma at pressures between 200 milliTorr and 20 Torr.

5. The method as claimed in claim 1 wherein said step of forming said barrier material in said barrier layer is performed in an oven in a nitrogen containing atmosphere.

6. The method as claimed in claim 1 wherein said step of forming said barrier material in said barrier layer is performed in an oven in a nitrogen atmosphere and including a step of controlling said step of forming said barrier material to control the density of the barrier material.

7. The method as claimed in claim 1 wherein said step of forming said barrier material in said barrier layer is performed using a nitrogen plasma and including a step of controlling said step of forming said barrier material to control the density of the barrier material.

8. The method as claimed in claim 1 wherein said step of forming said barrier material in said barrier layer is performed in an oven in a nitrogen atmosphere at a controlled temperature from 350° C. to 500° C. and including a step of controlling said step of forming said barrier material to control the density of the barrier material.

9. The method as claimed in claim 1 wherein said step of forming a layer of conductive material uses one of the materials selected from the group comprising aluminum, tungsten, doped polysilicon, copper-base alloys, gold, gold-base alloys, silver, and silver-base alloys.

10. A method of manufacturing a semiconductor device, comprising the steps of:

providing a semiconductor substrate with a dielectric layer formed thereon;

forming an opening in said dielectric layer, said opening defined by walls of said dielectric layer;

forming a barrier metal over said dielectric layer and in said opening, including along said walls, said barrier layer including a barrier metal selected from a group comprising tantalum, titanium, tungsten, and a combination thereof;

nitriding said barrier metal in-situ at a controlled temperature in a nitrogen containing atmosphere to control the depth and density of nitriding of said barrier metal whereby said nitriding is gradated to increase away from said dielectric layer; and forming a layer of conductive material in contact with said barrier metal, said conductive material layer substantially filling said opening.

11. The method as claimed in claim 10 including a step of controlling said step of nitriding to control the depth of nitriding of said barrier metal whereby said barrier material forms a layer above said barrier metal.

12. The method as claimed in claim 10 wherein said step of nitriding said barrier layer is performed using a nitrogen plasma.

13. The method as claimed in claim 10 wherein said step of forming said barrier material in said barrier layer is performed using a high density plasma at pressures between 200 milliTorr and 20 Torr.

14. The method as claimed in claim 10 wherein said step of nitriding said barrier layer is performed in an oven in an ammonium containing atmosphere.

15. The method as claimed in claim 10 wherein said step of nitriding said barrier layer is performed in an oven in a nitrogen atmosphere and including a step of controlling said step of nitriding to control the density of the barrier material.

16. The method as claimed in claim 10 wherein said step of nitriding said barrier layer is performed using a nitrogen plasma and including a step of controlling said step of nitriding to control the density of the barrier material.

17. The method as claimed in claim 10 wherein said step of nitriding said barrier layer is performed in an oven in an ammonium containing atmosphere at a controlled temperature from 350° C. to 500° C. and including a step of controlling said step of nitriding to control the density of the barrier material.

18. The method as claimed in claim 10 wherein said step of forming a layer of conductive material uses one of the materials selected from the group comprising aluminum, tungsten, doped polysilicon, copper-base alloys, gold, gold-base alloys, silver, and silver-base alloys.

* * * * *